(12) United States Patent
Bunce et al.

(10) Patent No.: US 7,233,542 B2
(45) Date of Patent: Jun. 19, 2007

(54) METHOD AND APPARATUS FOR ADDRESS GENERATION

(75) Inventors: Paul A. Bunce, Poughkeepsie, NY (US); John D. Davis, Wallkill, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 11/056,048

(22) Filed: Feb. 11, 2005

(65) Prior Publication Data

US 2006/0181951 A1    Aug. 17, 2006

(51) Int. Cl.
*G11C 8/00* (2006.01)

(52) U.S. Cl. ............ 365/230.05; 365/233; 365/189.01; 365/230.06

(58) Field of Classification Search ........... 365/230.05, 365/233, 189.01, 230.06, 230.03
See application file for complete search history.

(56) References Cited

U.S. PATENT DOCUMENTS

| | | | |
|---|---|---|---|
| 5,668,761 A | 9/1997 | Muhich et al. | |
| 5,943,288 A | 8/1999 | Jiang | |
| 6,469,953 B1 | 10/2002 | Hong | |
| 6,611,469 B2 * | 8/2003 | Williams et al. ............ | 365/221 |
| 6,657,886 B1 | 12/2003 | Adams et al. | |
| 6,711,664 B1 | 3/2004 | Gold et al. | |
| 6,741,493 B1 | 5/2004 | Christensen et al. | |
| 6,760,262 B2 * | 7/2004 | Haeberli et al. ....... | 365/189.09 |
| 6,842,373 B2 * | 1/2005 | La et al. ................ | 365/185.11 |
| 6,963,517 B2 * | 11/2005 | Chen .......................... | 365/233 |
| 2005/0007813 A1 | 1/2005 | Adams et al. | |

* cited by examiner

*Primary Examiner*—David Lam
(74) *Attorney, Agent, or Firm*—Cantor Colburn LLP

(57) ABSTRACT

A system for generating one or more common address signals for multi-port memory arrays. The system includes circuitry receiving one or more read address signal; circuitry receiving one or more write address signal; circuitry receiving an array clock signal; circuitry receiving one or more enable signal; and circuitry generating the common address signals in response to the enable signal, the array clock signal and one of the read address signal and write address signal.

8 Claims, 5 Drawing Sheets

CLOCK GENERATION SCHEME

FIG. 3 CLOCK GENERATION SCHEME

METHOD AND APPARATUS FOR ADDRESS GENERATION

BACKGROUND OF THE INVENTION

FIGS. 1A and 1B illustrate a high performance, low power domino SRAM design including multiple local cell groups such as that shown in U.S. Pat. No. 6,657,886, the entire contents of which are incorporated herein by reference. As shown in FIG. 1A, each cell group includes multiple SRAM cells 1-N and local true and complement bitlines LBLT and LBLC. Each SRAM cell includes a pair of inverters that operate together in a loop to store true and complement (T and C) data. The local true bitline LBLT and the local complement bitline LBLC are connected to each SRAM cell by a pair of wordline N-channel field effect transistors (NFETs) to respective true and complement sides of the inverters. A WORDLINE provides the gate input to wordline NFETs. A particular WORDLINE is activated, turning on respective wordline NFETs to perform a read or write operation.

As shown in FIG. 1B, the prior art domino SRAM includes multiple local cell groups 1-M. Associated with each local cell group are precharge true and complement circuits coupled to the respective local true and complement bitlines LBLT and LBLC, write true and write complement circuits, and a local evaluate circuit. Each of the local evaluate circuits is coupled to a global bitline labeled 2ND STAGE EVAL and a second stage inverter that provides output data or is coupled to more stages. A write predriver circuit receiving input data and a write enable signal provides write true WRITE T and write complement WRITE C signals to the write true and write complement circuits of each local cell group.

A read occurs when a wordline is activated. Since true and complement (T and C) data is stored in the SRAM memory cell, either the precharged high true local bitline LBLT will be discharged if a zero was stored on the true side or the precharged high complement bitline LBLC will be discharged if a zero was stored on the complement side. The local bitline, LBLT or LBLC connected to the one side will remain in its high precharged state. If the true local bitline LBLT was discharged then the zero will propagate through one or more series of domino stages eventually to the output of the SRAM array. If the true local bitline was not discharged then no switching through the domino stages will occur and the precharged value will remain at the SRAM output.

To perform a write operation, the wordline is activated as in a read. Then either the write true WRITE T or write complement WRITE C signal is activated which pulls either the true or complement local bitline low via the respective write true circuit or write complement circuit while the other local bitline remains at its precharged level, thus updating the SRAM cell.

SRAM cells are often arranged into large memory arrays consisting of rows and columns. The memory arrays may have multiple ports for reading from and writing to the SRAM cells.

SUMMARY OF THE INVENTION

Embodiments of the invention include a system for generating one or more common address signals for multi-port memory arrays. The system includes circuitry receiving one or more read address signal; circuitry receiving one or more write address signal; circuitry receiving an array clock signal; circuitry receiving one or more enable signal; and circuitry generating the common address signals in response to the enable signal, the array clock signal and one of the read address signal and write address signal.

Embodiments of the invention include circuitry for generating a common address signal for multi-port memory arrays. The circuitry includes a clock generation circuit and one or more first level decoding circuits. The first level decoding circuits are operable for merging one or more read address signals and one or more write address signals into the common address signal.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION

The present invention relates to an improvement in random access memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
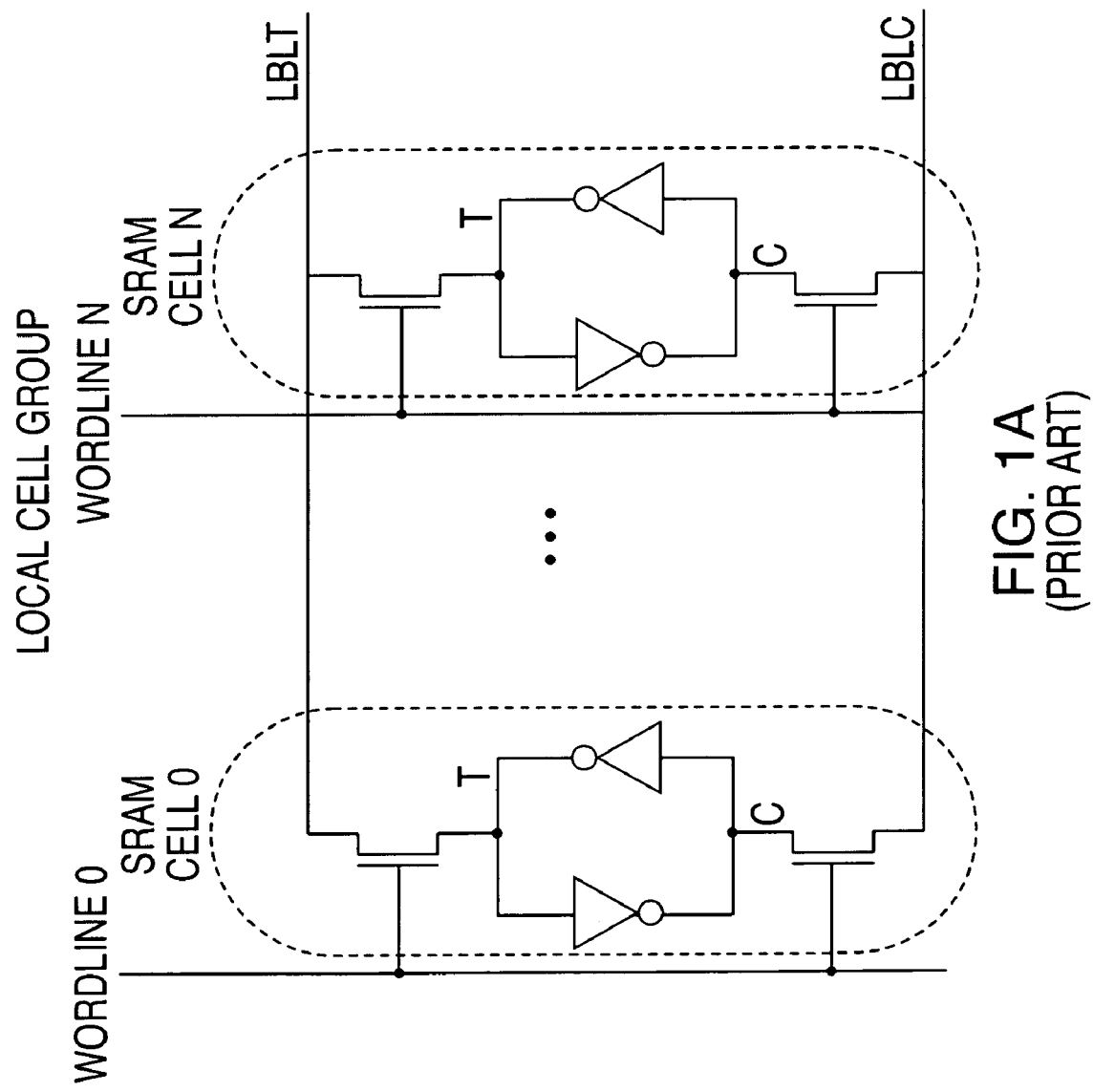
FIGS. 1A and 1B illustrate a high performance, low power domino SRAM design including multiple local cell groups
Figure 1B:
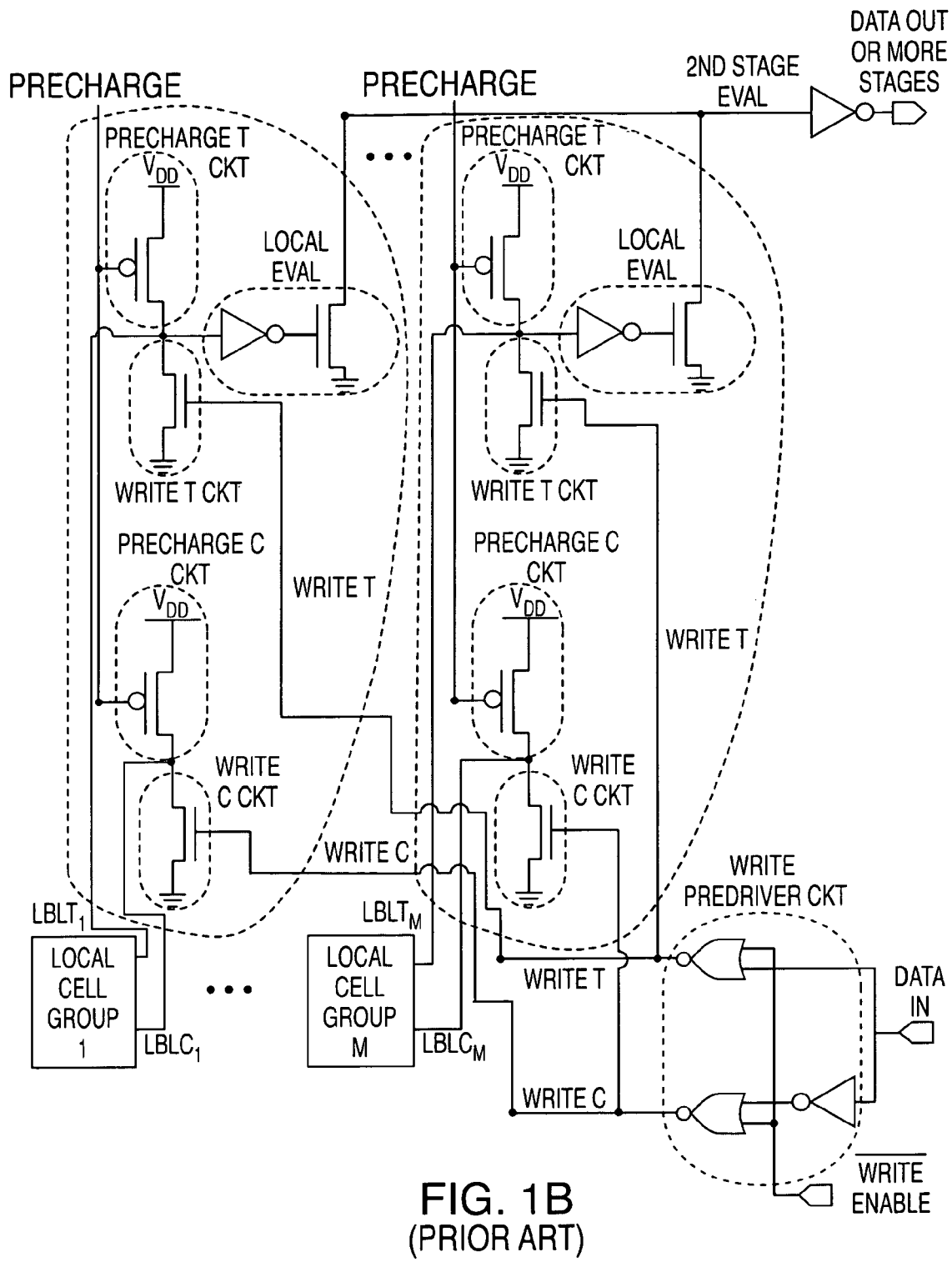
Figure 2:
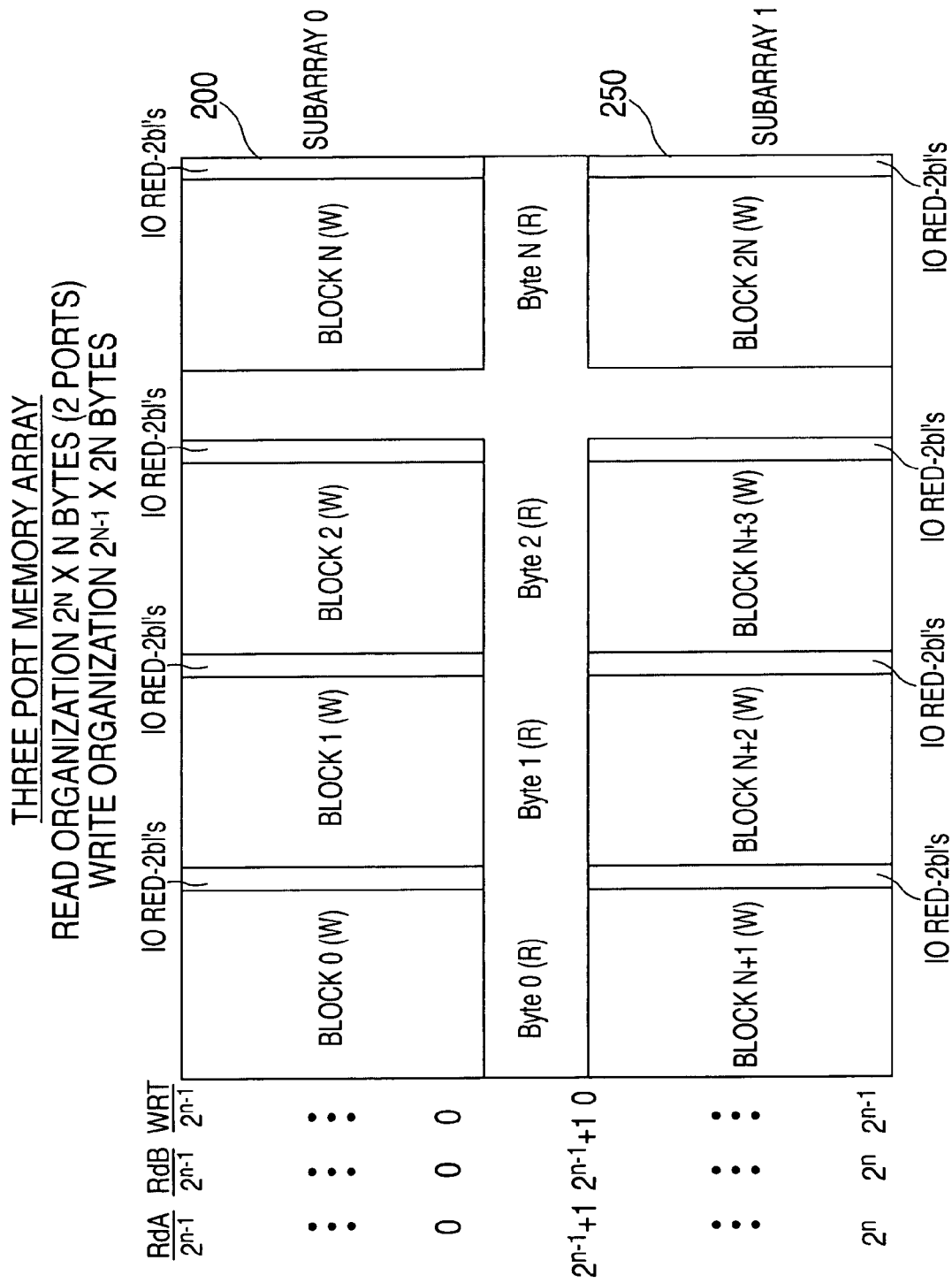
FIG. 2 illustrates an exemplary three port memory array.

FIG. 2 illustrates an exemplary three port memory array. The memory array is arranged in an upper sub-array 200 and a lower sub-array 250, each having a number SRAM cells as described with reference to FIG. 1A and 1B. The memory array may read from either sub-array through 2 ports, referenced as ports A and B. Each sub-array holds $2^{n-1}$ words. A read of the top sub-array is accomplished using addresses $0-2^{n-1}$. A read of the bottom sub-array is accomplished using addresses $2^{n-1}+1-2^n$. The two port read operation is depicted in FIG. 2 with the addresses in RdA and RdB columns.

For write operations, both sub-arrays 200 and 250 are accessed simultaneously using a write address ranging from $0-2^{n-1}$. This causes a write operation to be performed over all blocks across both sub-arrays 200 and 250. The single port write operation is depicted in FIG. 2 with the addresses in WRT column.

Figure 3:
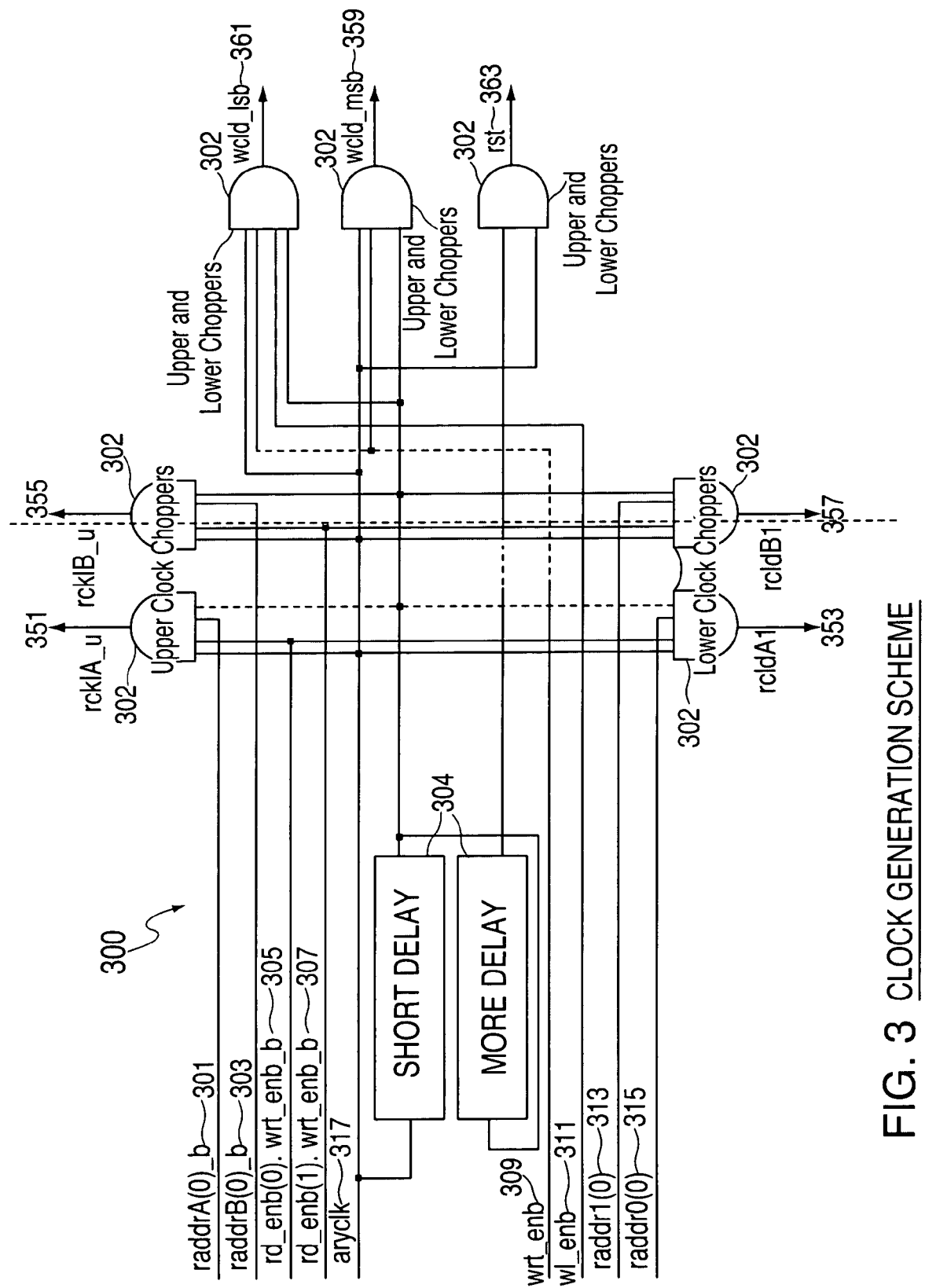
FIG. 3 illustrates an exemplary embodiment of a clock generation circuit.

Turning now to FIG. 3 an exemplary embodiment of a clock generation circuit 300 is depicted. The clock generation circuit 300 has one or more inputs and generates one or more outputs. The clock generation circuit 300 utilizes one or more AND gates 302 and one or more delay elements 304 to generate the desired output signals responsive to the input signals. The delay elements may be programmable for pulse width flexibility. The inputs to the clock generation circuit 300 may include a complement of a read address for port A position 0 signal 301, hereinafter referred to as raddrA(0)_b signal 301, a complement of a read address for port B position 0 signal 303, hereinafter referred to as raddrB(0)_b signal 303, a read enable for port A signal 305, hereinafter referred to as rd_enb(0) signal 305, a read enable for port B signal 307, hereinafter referred to as rd_enb(1) signal 307, a write enable signal 309, hereinafter referred to as wrt_enb signal 309, a wordline enable signal 311, hereinafter referred to as wl_enb signal 311, a read address for port A position 0 signal 313, hereinafter referred to as raddrA(0) signal 313, a read address for port B position 0 signal 315, hereinafter referred to as raddrB(0) signal 315, and an array clock signal 317, hereinafter referred to as aryclk signal 317.

Continuing with FIG. 3, the outputs of the clock generation circuit 300 may include a read sample clock signal 351 for port A corresponding to the upper sub-array 200, hereinafter referred to as rckiAu signal 351, a read sample clock signal 353 for port A corresponding to the lower sub-array 250, hereinafter referred to as rckiAl signal 353, a read sample clock signal 355 for port B corresponding to the upper sub-array 200, hereinafter referred to as rckiBu signal 355, a read sample clock signal 357 for port B corresponding to the lower sub-array 250, hereinafter referred to as rckiBl signal 375, a write sample clock signal corresponding to the most significant address bit 359, hereinafter referred to as wcki_msb signal 359, a write sample clock signal corresponding to the least significant address bit 361, hereinafter referred to as wcki_lsb signal 361, and an evaluate pulse signal 363, hereinafter referred to as rst signal 363. The clock generation circuit 300 ensures that only one of the read and write sample clocks is active during a given cycle.

As shown in FIG. 3, the read sample clocks, the rckiAu signal 353, the rckiAl signal 355, the rckiBu signal 373, and the rckiBl signal 375, are split into upper and lower clock signals, corresponding to upper sub-array 200 and lower sub-array 250 based on the most significant address bit of the raddrA(0) signal 313 and the raddrB(0) signal 315. Similarly, the write sample clocks wcki_lsb signal 361 and wcki_msb signal 359 are split to drive the most significant and least significant address bits separately The rst signal 363 is an evaluation pulse that provides a clock signal to one or more first level decoding circuits. The rst signal 363 is designed to rise simultaneously with the read or write sample clocks and return to a low state after a designed pulse width. The read and write sample clocks are designed to sample addresses when in the high state using a narrow pulse width. Once the read and write sample clocks return to the low state the input addresses are allowed to change. The timing critical address path is simplified by using the read and write sample clocks to sample addresses by removing the need for the address inputs to be latched. As depicted in FIG. 3, the rd_enb(0) signal 305, rd_enb(1) signal 307, and the wrt_enb signal 311 are used to guarantee that only read or write sample clocks are active for a given cycle. Read sample clocks for port A and port B may be active simultaneously for a given cycle.

Figure 4:
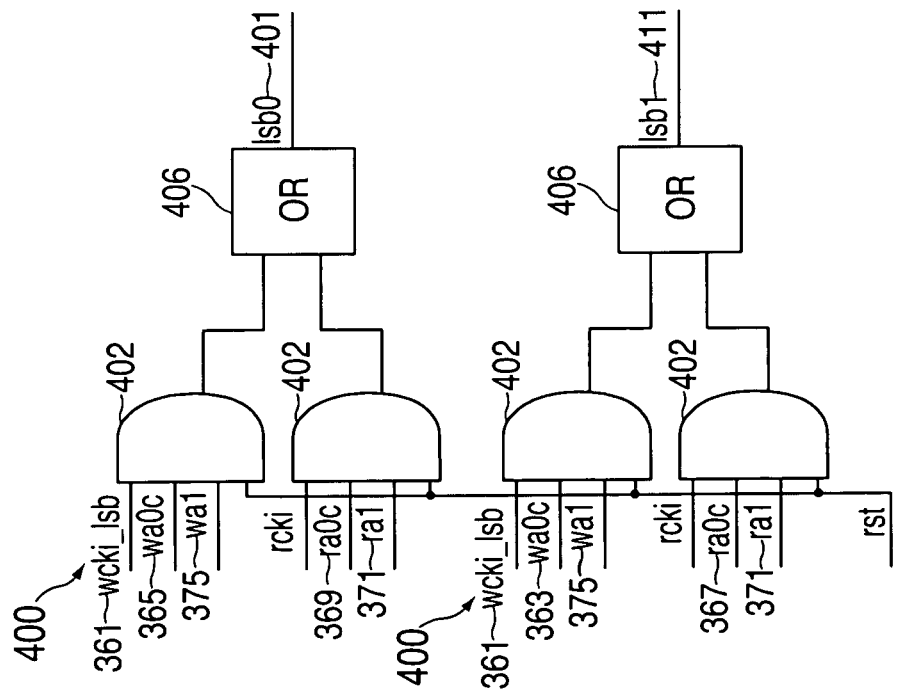
FIG. 4 illustrates an exemplary embodiment of an address decode circuit.

Turning now FIG. 4 where exemplary embodiments of two first level decoding circuits 400 are depicted. The outputs of each first level decoding circuit 400 are transmitted to a final decoding circuit, which selects a specific wordline in the memory array. As depicted in FIG. 4, each first level decoding circuit 400 receives one or more input signals and generates and transmits an output signal. Each first level decoding circuit 400 uses one or more AND gates 402 and one or more OR gates 406 to generate output signals responsive to the input signals. The first level decoding circuit 400 receives a write sample clock from the clock generation circuit 300, the write sample clock may be either the wcki_lsb signal 361 or the wcki_msb signal 359 depending on the address that is being decoded. Similarly, the first level decoding circuit 400 receives a read sample clock from the clock generation circuit 300, the read sample clock may be the rckiAu signal 351, the rckiBu signal 355, the rckiAl signal 353, or the rckiBl signal 357. The first level decoding circuit 400 also receives either a first true or complement write address signal, hereinafter referred to as wa0t signal 363 and wa0c signal 365 respectively, a second write address signal, hereinafter referred to as wa1 signal 375, a first true or complement read address signal, hereinafter referred to as ra0t 367 and ra0c signal 369 respectively, and a second read address signal, hereinafter referred to as ra1 371.

In an exemplary embodiment, two first level decoding circuits 400 are used for every two addresses to be decoded. For example, every two addresses that are to be decoded generate corresponding lsbN or msbN signals. FIG. 4 depicts the first level decoding circuits 400 that correspond to the lsbN signals for two addresses, the lsb0 signal 401 and the lsb1 signal 411. Although not depicted, in this embodiment there would also be two first level decoding circuits 400 that would generate two msb signals. The lsb and msb signals generated by the first level decoding circuits 400 represent common address signals that are transmitted to a final decoding circuit, which selects a specific location in the memory array.

The first level decoding circuits 400 merge the read and write addresses into a common address, which allows common address lines to be used for the final decoding by the memory array. The clock generation circuit 300 supplies clock signals to the first level decoding circuits 400 to ensure that the first level decoding circuit 400 properly merges the read and write addresses into a common address. A reset signal, labeled rst, may be applied to AND gates 402 to reset the output as needed.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the claims.

What is claimed is:

1. Circuitry for generating a common address signal for multi-port memory arrays, the multi-port memory array including a first sub-array and a second sub-array, the circuitry comprising:

a clock generation circuit, the clock generation circuit generating a write sample clock to enable a write to both the first sub-array and the second sub-array, a first read sample clock to enable a read from the first sub-array and a second read sample clock to enable a read from the second sub-array, the clock generation circuit excluding generation of the first read sample clock and the second read sample clock when the write sample clock is active; and one or more first level decoding circuits including:

first decoding circuitry receiving the write sample clock, a write address, the first read sample clock and a read address, the first decoding circuit generating a write address on a first address line for both the first sub-array and the second sub-array when the write sample clock is enabled, the first decoding circuit generating a read address on the first address line for one of the first sub-array and the second sub-array when the read sample clock is enabled.

2. The circuitry of claim 1 wherein:
said clock generation circuit is operable for generating at least one of:
   one or more read sample clock signals; and
   one or more write sample clock signals.

3. The circuitry of claim 2 wherein said clock generation circuit generates a single sample clock signal during a cycle.

4. The circuitry of claim 1 wherein:
the first decoding circuitry includes:
   a first gate logically combining the write sample clock and the write address;
   a second gate logically combining the first read sample clock and the read address;
   a third gate logically combining the output of the first gate and the output of the second gate to generate one of the write address and the read address.

5. The circuitry of claim 4 wherein:
the first gate is an AND gate, the second gate is an AND gate and the third gate is an OR gate.

6. The circuitry of claim 1 wherein:
the one or more first level decoding circuits include:
second decoding circuitry receiving the write sample clock, the write address, a second read sample clock and a second read address, the second decoding circuit generating a write address on a second address line for both the first sub-array and the second sub-array when the write sample clock is enabled, the second decoding circuit generating a read address on the second address line for one of the first sub-array and the second sub-array when the second read sample clock is enabled.

7. The circuitry of claim 6 wherein:
the first decoding circuitry includes:
   a first gate logically combining the write sample clock and the write address;
   a second gate logically combining the second read sample clock and the read address;
   a third gate logically combining the output of the first gate and the output of the second gate to generate one of the write address and the read address.

8. The circuitry of claim 7 wherein:
the first gate is an AND gate, the second gate is an AND gate and the third gate is an OR gate.

* * * * *